US012418285B2

(12) United States Patent
Miyachi et al.

(10) Patent No.: US 12,418,285 B2
(45) Date of Patent: Sep. 16, 2025

(54) SWITCH CIRCUIT

(71) Applicant: TOYOTA BOSHOKU KABUSHIKI KAISHA, Aichi (JP)

(72) Inventors: Reina Miyachi, Aichi (JP); Naoya Hanada, Aichi (JP)

(73) Assignee: TOYOTA BOSHOKU KABUSHIKI KAISHA, Aichi (JP)

( * ) Notice: Subject to any disclaimer, the term of this patent is extended or adjusted under 35 U.S.C. 154(b) by 140 days.

(21) Appl. No.: 18/543,638

(22) Filed: Dec. 18, 2023

(65) Prior Publication Data

US 2024/0235544 A1 Jul. 11, 2024

(30) Foreign Application Priority Data

Jan. 10, 2023 (JP) ................................ 2023-001797

(51) Int. Cl.
*H03K 17/687* (2006.01)
*B60R 16/027* (2006.01)
*H03K 17/12* (2006.01)
*B60N 2/02* (2006.01)

(52) U.S. Cl.
CPC ......... *H03K 17/122* (2013.01); *B60R 16/027* (2013.01); *B60N 2/0224* (2013.01)

(58) Field of Classification Search
None
See application file for complete search history.

(56) References Cited

U.S. PATENT DOCUMENTS

| 4,456,861 A * | 6/1984 | Ratzel | B60N 2/0248 |
| | | | 318/568.1 |
| 4,967,178 A * | 10/1990 | Saito | B60N 2/0228 |
| | | | 340/460 |
| 7,239,096 B2 * | 7/2007 | Hancock | B60N 2/0252 |
| | | | 318/59 |

FOREIGN PATENT DOCUMENTS

JP 50-27058 3/1975

* cited by examiner

*Primary Examiner* — Jeffrey S Zweizig
(74) *Attorney, Agent, or Firm* — Greenblum & Bernstein, P.L.C.

(57) ABSTRACT

A switch circuit includes a switch element, a control circuit, a supply line, a switch line that connects the switch element in parallel to a parallel part of the supply line, an input line that allows input of a current from the switch line to the control circuit, a first FET and a second FET provided in the parallel part, and a third FET provided in the switch line in parallel to the input line. The second FET includes a body diode having a forward direction opposite to a forward direction of a body diode of the first FET. The third FET includes a body diode having a forward direction coincident with a direction in which a current is supplied to the load via the switch element.

6 Claims, 5 Drawing Sheets

SWITCH CIRCUIT

CROSS-REFERENCE TO RELATED APPLICATIONS

The present application claims priority based on Japanese Patent Application No. 2023-001797 filed to the Japan Patent Office on Jan. 10, 2023, and the entire content of Japanese Patent Application No. 2023-001797 is incorporated herein by reference.

BACKGROUND

The present disclosure relates to a switch circuit.

If a minute current flows through a switch element in a switch circuit for supplying a current to a load such as a motor, the minute current causes removal of an insulating film, which has been used for protection of the switch element (see, for example, Japanese Unexamined Patent Application Publication No. S50-27058).

SUMMARY

In a conventional switch circuit, when a large current flows through a switch element, loss of the circuit increases. Thus, when a current is supplied to a load via the switch element, there may be a limit to magnitude of the current.

One aspect of the present disclosure has an object to provide a switch circuit that can allow a large current to flow through a switch element.

One aspect of the present disclosure is a switch circuit comprising a first switch element, a control circuit, a supply line configured to allow supply of a current from a power source to a load, a first switch line that connects the first switch element in parallel to a parallel part, which is a part of the supply line, a first input line configured to allow input of a current from the first switch line to the control circuit, a first FET and a second FET provided in the parallel part, and a third FET provided in the first switch line in parallel to the first input line.

The first FET comprises a first body diode having a forward direction coincident with a direction in which a current is supplied to the load. The second FET comprises a second body diode having a forward direction opposite to the forward direction of the first body diode. The third FET comprises a third body diode having a forward direction coincident with a direction in which a current is supplied to the load via the first switch element.

The control circuit is configured to switch on the first FET and the second FET and switch off the third FET when the control circuit receives no current input from the first input line, and to switch off the first FET and the second FET and switch on the third FET when the control circuit receives a current input from the first input line.

In such a configuration, when the first switch element is closed, the first FET and the second FET turn off, so that the current does not flow through the parallel part but is supplied from the first switch line provided with the first switch element to the load. This leads to interruption of the current from the power source in the parallel part, so that a large current can be caused to flow through the first switch element. Further, since a current is inhibited from flowing from the parallel part into the first input line, the control circuit can detect opening and closing of the first switch element.

When the first switch element is open, the third FET turns off, so that the current does not flow through the first switch line but is supplied from the parallel part to the load. Thus, a current is inhibited from flowing from the parallel part into the first input line, and the control circuit can detect opening and closing of the first switch element.

One aspect of the present disclosure may further comprise a second switch element, a second switch line that connects the second switch element in parallel to the parallel part, a second input line configured to allow input of a current from the second switch line to the control circuit, and a fourth FET provided in the second switch line in parallel to the second input line. The fourth FET comprises a fourth body diode having a forward direction coincident with a direction in which a current is supplied to the load via the second switch element.

The control circuit may be configured to switch on the first FET and the second FET and switch off the third FET and the fourth FET when the control circuit receives no current input from either the first input line or the second input line, and to switch off the first FET, the second FET and the third FET and switch on the fourth FET when the control circuit receives a current input from the second input line.

In such a configuration, it is possible to cause a large current to flow through each of the first switch element and the second switch element. Further, the control circuit can detect opening and closing of each of the first switch element and the second switch element.

One aspect of the present disclosure may further comprise a current switching circuit provided in the supply line between a connection point, at which the first switch line and the second switch line are connected, and the load. The second switch element may be configured not to be closed concurrently with the first switch element. The control circuit may be configured to control the current switching circuit to cause a current to flow through the load in a first direction when the control circuit receives the current input from the first input line, and to control the current switching circuit to cause a current to flow through the load in a second direction opposite to the first direction when the control circuit receives the current input from the second input line.

In such a configuration, a selection operation between the first switch element and the second switch element enables a change in the direction of the current to be supplied to the load.

One aspect of the present disclosure may be arranged in a vehicle seat. In such a configuration, it is possible to supply a current to the load that transforms the vehicle seat while removing an insulating film of the first switch element.

BRIEF DESCRIPTION OF THE DRAWINGS

An embodiment of the present disclosure will be described hereinafter by way of examples with reference to the accompanying drawings, in which.

DETAILED DESCRIPTION OF EXEMPLARY EMBODIMENTS

Hereinafter, embodiments applied with the present disclosure will be described with reference to the drawings.

1. First Embodiment 1-1. Configuration

Figure 1:
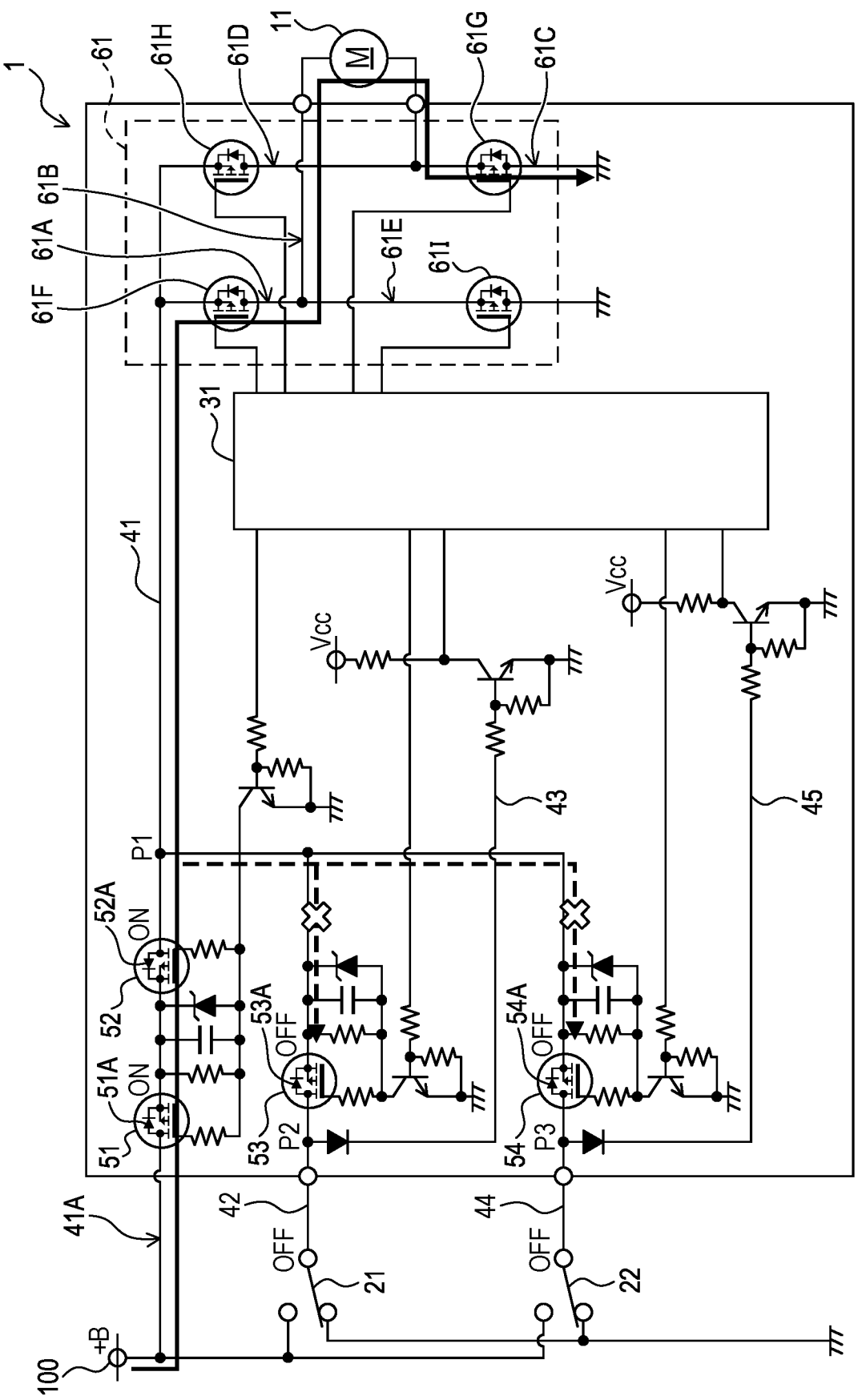
FIG. 1 is a schematic circuit diagram of a switch circuit in an embodiment.

A switch circuit 1 shown in FIG. 1 comprises a load 11, a first switch element 21, a second switch element 22, a control circuit 31, a supply line 41, a first switch line 42, a first input line 43, a second switch line 44, a second input line 45, a first FET 51, a second FET 52, a third FET 53, a fourth FET 54, and a current switching circuit 61.

Figure 2:
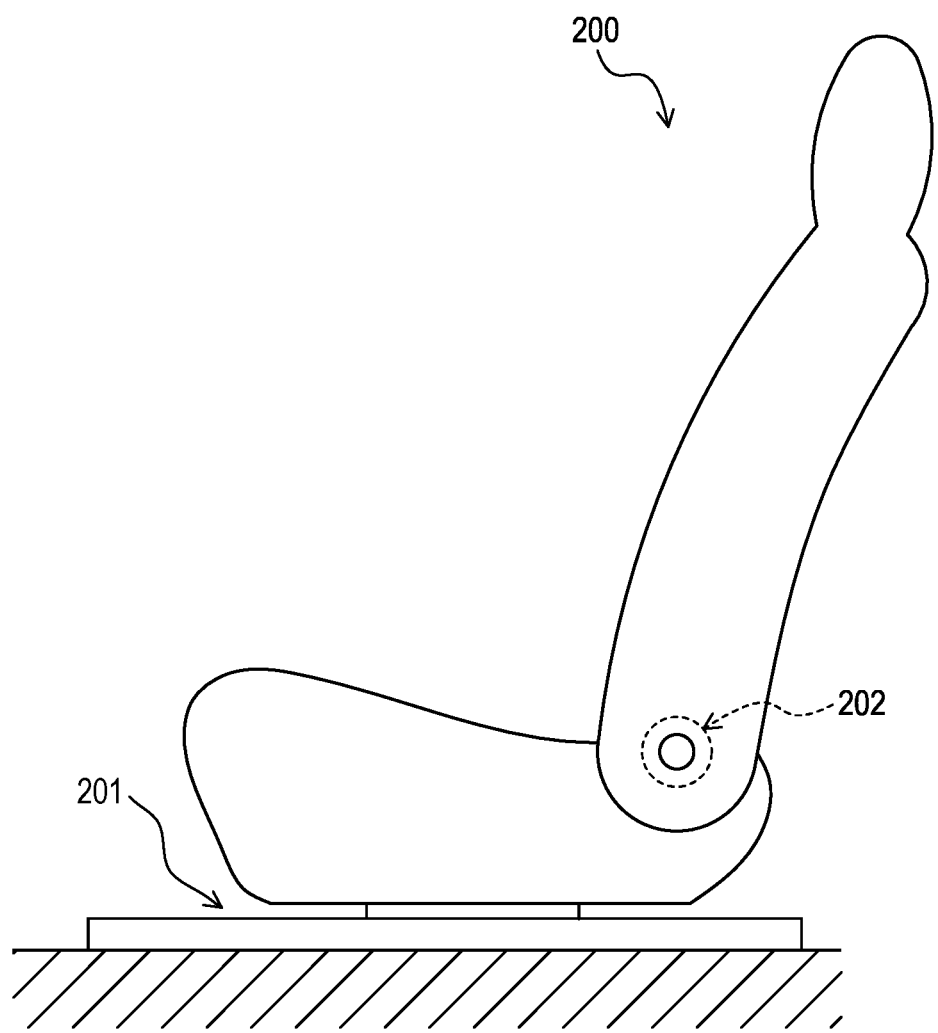
FIG. 2 is a schematic perspective view of a vehicle seat in an embodiment.

The switch circuit 1 is arranged in a vehicle seat 200 shown in FIG. 2. The vehicle seat 200 is installed in a vehicle such as an automobile, a railroad vehicle, a ship/boat, or an aircraft. The switch circuit 1 is used for applications, for example, for driving a sliding device 201 or a recliner 202 of the vehicle seat 200.

<Load>

The load 11 shown in FIG. 1 is, for example, a motor to shift the sliding device 201 or the recliner 202. The load 11 is supplied with a current from a power source 100 included in the vehicle installed with the vehicle seat 200.

<First Switch Element>

The first switch element 21 is configured to cause a current to flow through the load 11 in a first direction in a closed state of the first switch element 21.

The first switch element 21 includes a contact to be connected to the power source 100 in the closed state of the first switch element 21, and to be earthed in an open state of the first switch element 21. The first switch element 21 is opened and closed, for example, in conjunction with a physical switch for sliding the vehicle seat 200 frontward.

<Second Switch Element>

The second switch element 22 is configured to cause a current to flow through the load 11 in a second direction opposite to the first direction, in a closed state of the second switch element 22.

The second switch element 22 includes a contact to be connected to the power source 100 in the closed state of the second switch element 22, and to be earthed in an open state of the second switch element 22. The second switch element 22 is opened and closed, for example, in conjunction with the physical switch for sliding the vehicle seat 200 rearward.

The second switch element 22 is configured not to be closed concurrently with the first switch element 21 by a physical structure (e.g., a lock mechanism). Thus, the second switch element 22 can be closed only when the first switch element 21 is open.

<Control Circuit>

The control circuit 31 is an interface circuit configured to individually switch on and off a plurality of Field Effect Transistors (FETs) included in the switch circuit 1, in response to receiving an input of a signal current. The control circuit 31 is connected to a gate of each FET.

The control circuit 31 is connected with the first input line 43, the second input line 45, and a plurality of output lines connected to the gates of the FETs respectively. As the control circuit 31, for example, a known microcomputer may be used. Specific control of the control circuit 31 will be described below.

<Supply Line>

The supply line 41 allows supply of the current from the power source 100 to the load 11. Specifically, the supply line 41 connects the power source 100 and the load 11 via the current switching circuit 61.

Further, the supply line 41 comprises a parallel part 41A connected with the first switch line 42 and the second switch line 44 in parallel. The parallel part 41A is provided on a side closer to the power source 100 than the current switching circuit 61 (that is, upstream of the current switching circuit 61).

<First Switch Line>

The first switch line 42 connects the first switch element 21 in parallel to the parallel part 41A of the supply line 41. In the first switch line 42, the first switch element 21 and the third FET 53 are provided in this order from a side closer to the power source 100.

<First Input Line>

The first input line 43 allows input of a current from the first switch line 42 to the control circuit 31. The first input line 43 has one end connected to the first switch line 42 between the first switch element 21 and the third FET 53. When the first switch element 21 is closed, the current is input from the first input line 43 to the control circuit 31.

<Second Switch Line>

The second switch line 44 connects the second switch element 22 in parallel to the parallel part 41A of the supply line 41. In the second switch line 44, the second switch element 22 and the fourth FET 54 are provided in this order from a side closer to the power source 100.

<Second Input Line>

The second input line 45 allows input of a current from the second switch line 44 to the control circuit 31. The second input line 45 has one end connected to the second switch line 44 between the second switch element 22 and the fourth FET 54. When the second switch element 22 is closed, the current is input from the second input line 45 to the control circuit 31.

<FET>

The first FET 51 and the second FET 52 are general-purpose field effect transistors provided in the parallel part 41A of the supply line 41. The first FET 51 and the second FET 52 are connected in parallel to both of the first switch element 21 and the second switch element 22.

The first FET 51 is switched on and off in accordance with a current input from the control circuit 31. The first FET 51 includes a first body diode 51A having a forward direction coincident with a direction in which a current is supplied from the power source 100 to the load 11. Herein, the body diode is a diode arranged at a back gate.

The second FET 52, along with the first FET 51, is switched on and off in accordance with the current input from the control circuit 31. The second FET 52 includes a second body diode 52A having a forward direction opposite to the forward direction of the first body diode 51A (that is, a reverse direction toward the power source 100).

The first FET 51 and the second FET 52 are concurrently switched on or off by the control circuit 31. In other words, the control circuit 31 switches between a state, in which both the first FET 51 and the second FET 52 are switched off, and a state, in which both the first FET 51 and the second FET 52 are switched on.

In the state in which both the first FET 51 and the second FET 52 are switched off, a current directed to the load 11 flows through the first FET 51, but a current directed to the power source 100 in the reverse direction does not flow through the first FET 51. Simultaneously, a current directed to the load 11 does not flow through the second FET 52. As a result, no current flows through the parallel part 41A.

In the state in which both the first FET 51 and the second FET 52 are switched on, the current flows through both of the first FET 51 and the second FET 52 toward the load 11. As a result, the current flows through the parallel part 41A.

The third FET 53 is a general-purpose field effect transistor provided in the first switch line 42 in parallel to the first input line 43. Specifically, the third FET 53 is provided in the first switch line 42 on a side closer to the load 11 than a connection point P2 between the first switch element 21 and the first input line 43.

The third FET 53 includes a third body diode 53A having a forward direction coincident with a direction in which a current is supplied to the load 11 via the first switch element 21. The third FET 53 is switched on or off by the control circuit 31. In a state in which the third FET 53 is switched off, a current directed from the first switch element 21 toward the power source 100 in the first switch line 42 in the reverse direction does not flow.

The fourth FET 54 is a general-purpose field effect transistor provided in the second switch line 44 in parallel to the second input line 45. Specifically, the fourth FET 54 is provided in the second switch line 44 on a side closer to the load 11 than a connection point P3 between the second switch element 22 and the second input line 45.

The fourth FET 54 includes a fourth body diode 54A having a forward direction coincident with a direction in which a current is supplied to the load 11 via the second switch element 22. The fourth FET 54 is switched on or off by the control circuit 31. In a state in which the fourth FET 54 is switched off, a current directed from the second switch element 22 toward the power source 100 in the second switch line 44 in the reverse direction does not flow.

<Current Switching Circuit>

The current switching circuit 61 is provided in the supply line 41 between a connection point P1, at which the first switch line 42 and the second switch line 44 are connected, and the load 11.

The current switching circuit 61 comprises a first line 61A, a second line 61B, a third line 61C, a fourth line 61D, a fifth line 61E, a first switching FET 61F, a second switching FET 61G, a third switching FET 61H, and a fourth switching FET 61I.

In the closed state of the first switch element 21, the first line 61A allows supply of a current to the second line 61B provided with the load 11 in the first direction. The first switching FET 61F is provided in the first line 61A.

The third line 61C is connected in series with the second line 61B and the fourth line 61D, and connects the second line 61B to the ground. The second switching FET 61G is provided in the third line 61C.

In the closed state of the second switch element 22, the fourth line 61D allows supply of a current to the second line 61B provided with the load 11 in the second direction. The fourth line 61D is connected in parallel to the first line 61A. The third switching FET 61H is provided in the fourth line 61D, The fifth line 61E is connected in series with the first line 61A and the second line 61B, and connects the second line 61B to the ground. The fifth line 61E is connected in parallel to the third line 61C. The fourth switching FET 61I is provided in the fifth line 61E.

In the state in which the second switch element 22 is open, the control circuit 31 switches on the first switching FET 61F and the second switching FET 61G, and switches off the third switching FET 61H and the fourth switching FET 61I. Accordingly, the current flows through the first line 61A, the second line 61B, and the third line 61C in this order.

In the state in which the second switch element 22 is closed, the control circuit 31 switches off the first switching FET 61F and the second switching FET 61G, and switches on the third switching FET 61H and the fourth switching FET 61I. Accordingly, the current flows through the fourth line 61D, the second line 61B, and the fifth line 61E in this order.

<Control by Control Circuit>

As shown in FIG. 1, the control circuit 31 switches on the first FET 51 and the second FET 52 and switches off the third FET 53 and the fourth FET 54 when both the first switch element 21 and the second switch element 22 are open, or when the control circuit 31 receives no current input from either the first input line 43 or the second input line 45.

In this state, the current supplied from the power source 100 passes through the parallel part 41A where the first FET 51 and the second FET 52 are provided, and flows to the load 11. At this time, the third FET 53 and the fourth FET 54 inhibit a current from flowing from the supply line 41 into the first switch line 42 and the second switch line 44 (see broken lines of FIG. 1). Thus, it is possible to inhibit occurrence of a short circuit in the circuit, and thus inhibit damages to the elements.

Figure 3:
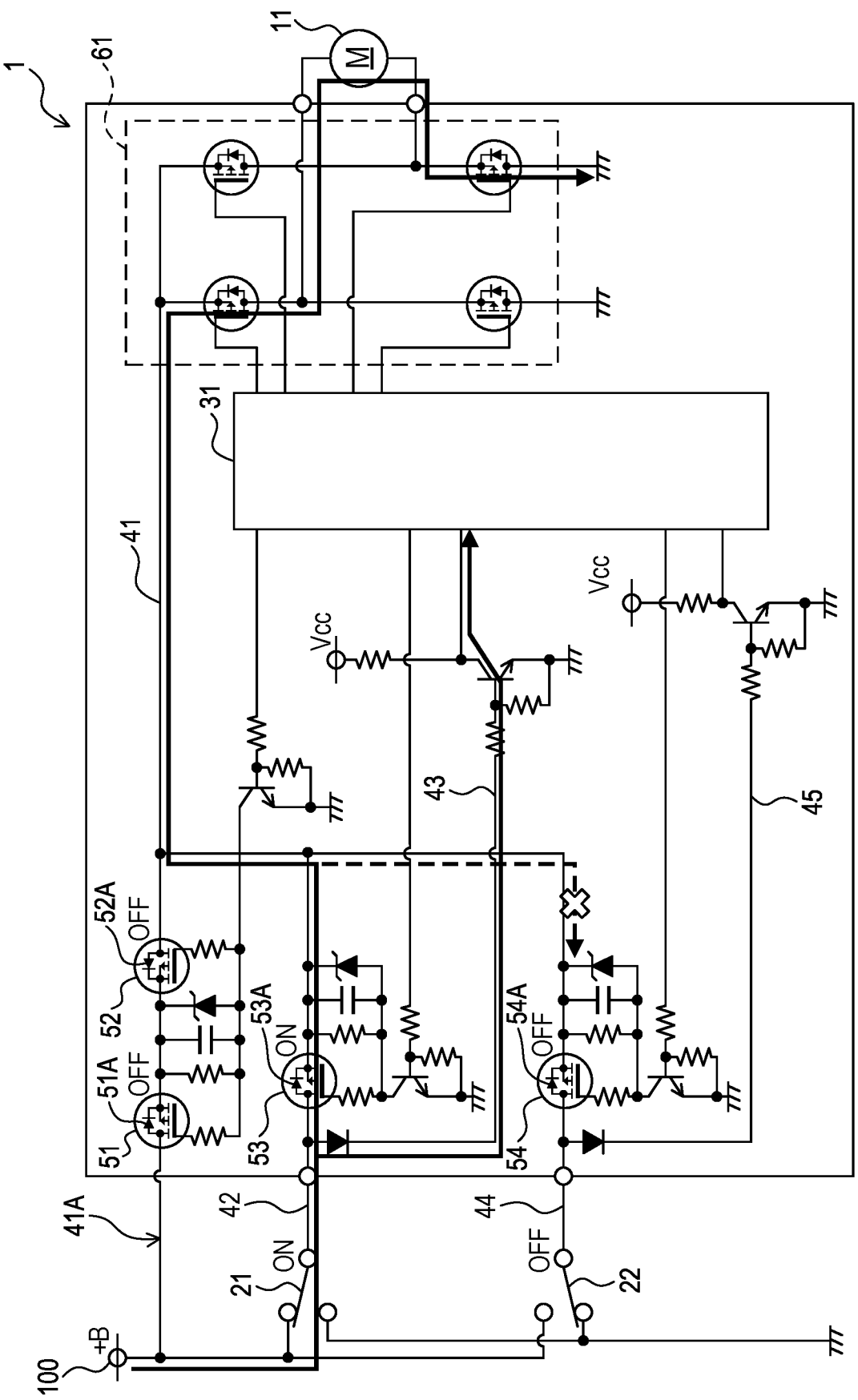
FIG. 3 is a schematic circuit diagram showing a state in which a first switch element is closed in the switch circuit of FIG. 1.

As shown in FIG. 3, the control circuit 31 switches off the first FET 51 and the second FET 52, switches on the third FET 53, and switches off the fourth FET 54 when the first switch element 21 is closed, or when the control circuit 31 receives a current input from the first input line 43. Also, the control circuit 31 controls the current switching circuit 61 to cause the current to flow through the load 11 in the first direction when the control circuit 31 receives the current input from the first input line 43.

In this state, the current supplied from the power source 100 passes through the first switch line 42 provided with the first switch element 21, and flows to the load 11. At this time, the fourth FET 54 inhibits a current from flowing from the first switch line 42 into the second switch line 44 (see a broken line of FIG. 3). Further, the first FET 51 inhibits a reverse flow of a current in the parallel part 41A.

Figure 4:
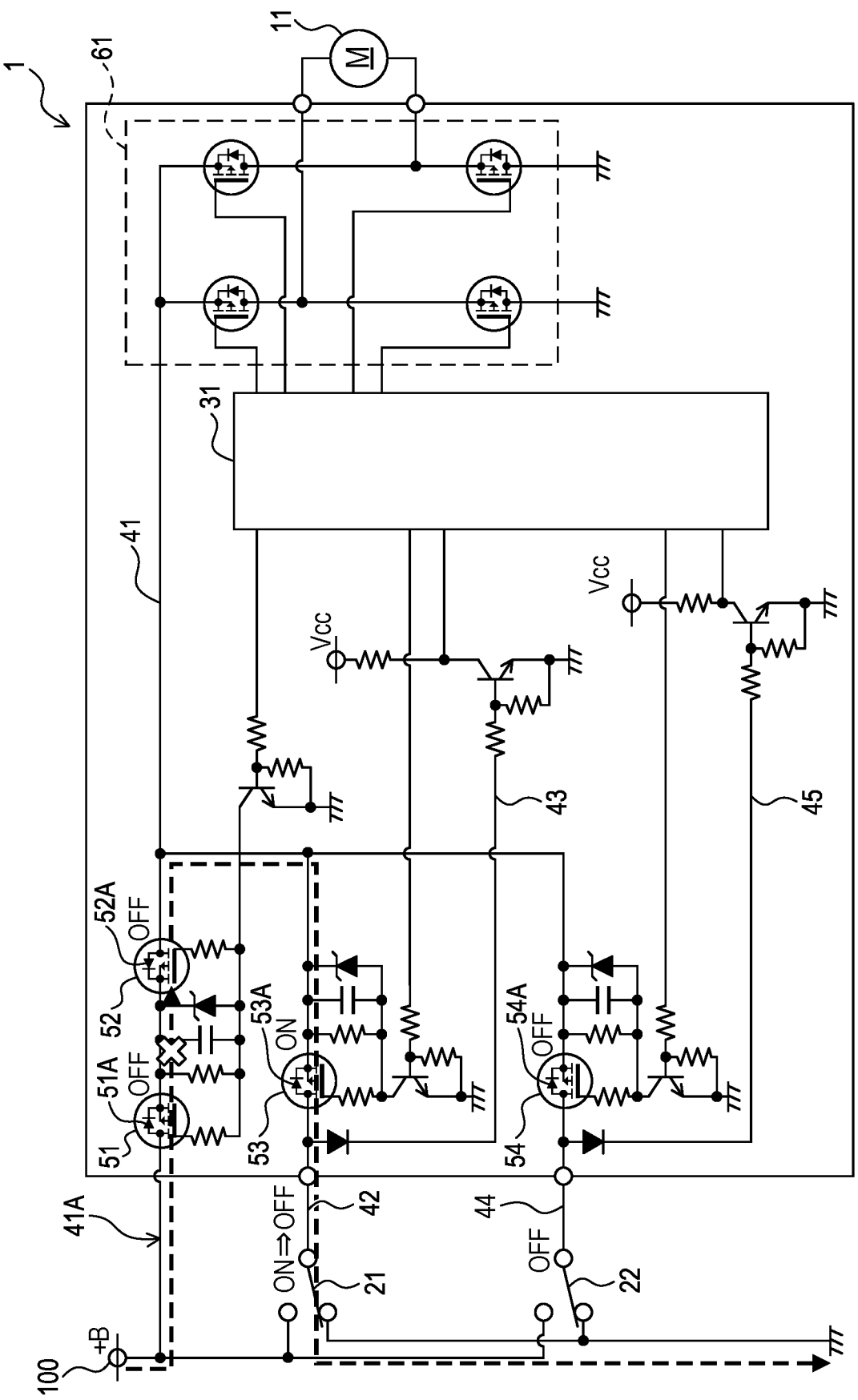
FIG. 4 is a schematic circuit diagram showing a state immediately after the first switch element is opened in the switch circuit of FIG. 1.

If the second FET 52 is not present, when the first switch element 21 in the closed state is opened, a current flows from the parallel part 41A into the first switch element 21 until the third FET 53 switches to the off state as shown by a broken line in FIG. 4.

In contrast, since the second FET 52 is provided in the parallel part 41A, no current flows through the parallel part 41A until the third FET 53 turns off and the first FET 51 and the second FET 52 turn on. That is, the second FET 52 inhibits a short circuit in the circuit when the first switch element 21 is opened.

Figure 5:
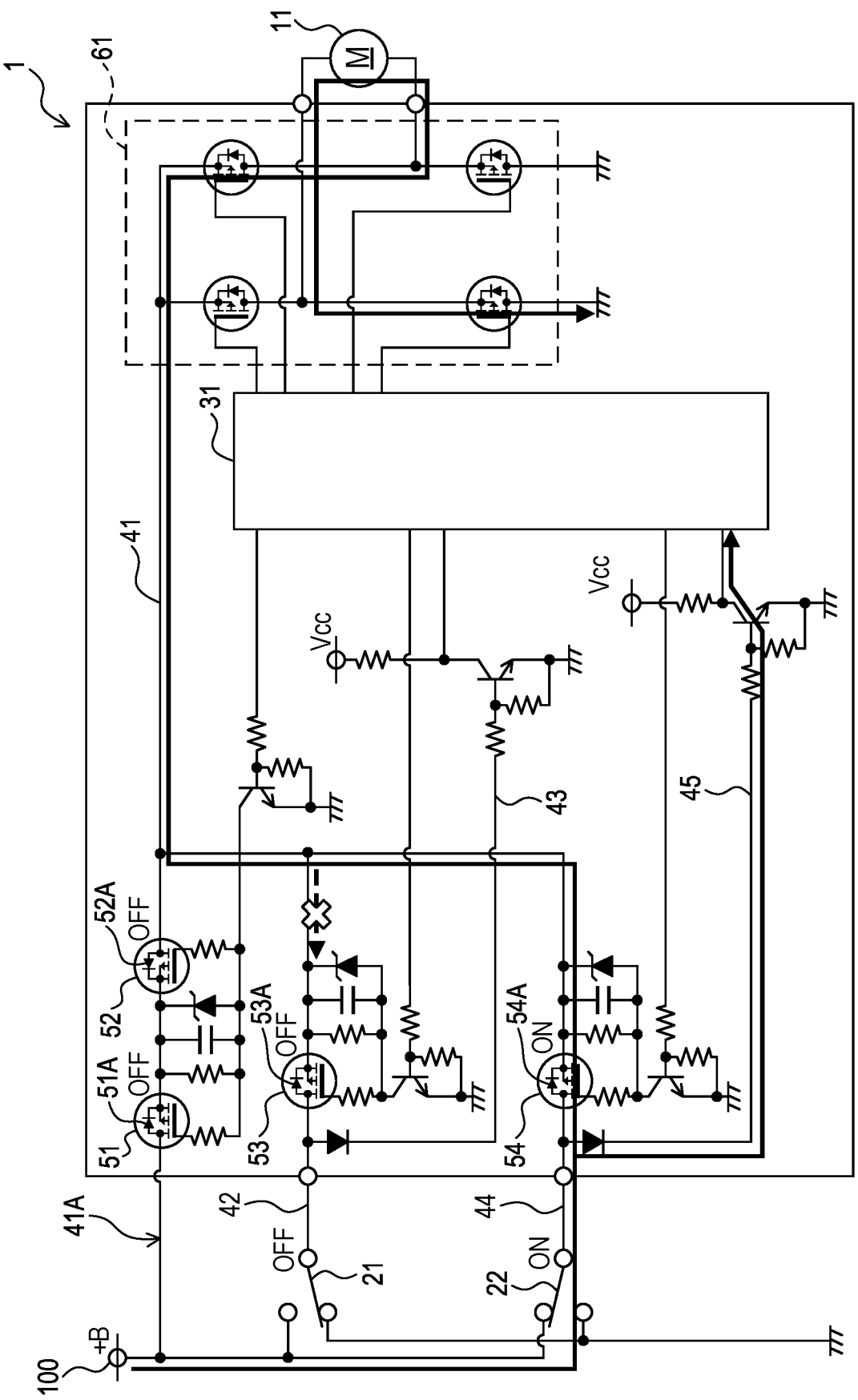
FIG. 5 is a schematic circuit diagram showing a state in which a second switch element is closed in the switch circuit of FIG. 1.

As shown in FIG. 5, the control circuit 31 switches off the first FET 51 and the second FET 52, switches on the fourth FET 54, and switches off the third FET 53 when the second switch element 22 is closed, or when the control circuit 31 receives a current input from the second input line 45. Also, the control circuit 31 controls the current switching circuit 61 to cause the current to flow through the load 11 in the second direction when the control circuit 31 receives the current input from the second input line 45.

In this state, the current supplied from the power source 100 passes through the second switch line 44 provided with the second switch element 22, and flows to the load 11. At this time, the third FET 53 inhibits a current from flowing from the second switch line 44 into the first switch line 42 (see a broken line in FIG. 5).

When the second switch element 22 in the closed state is opened, the second FET 52 that is switched off inhibits the current from flowing into the parallel part 41A, as in the case of opening the first switch element 21.

1-2. Effects

The embodiment as detailed above exerts following effects.

(1a) When the first switch element 21 is closed, the first FET 51 and the second FET 52 turn off, so that the current does not flow through the parallel part 41A but is supplied to the load 11 from the first switch line 42 provided with the first switch element 21. This leads to interruption of the current from the power source 100 in the parallel part 41A, so that a large current can be caused to flow through the first switch element 21. Further, since the current is inhibited from flowing from the parallel part 41A into the first input line 43, the control circuit 31 can detect opening and closing of the first switch element 21.

(1b) When the first switch element 21 is open, the third FET 53 turns off, so that the current does not flow through the first switch line 42 but is supplied from the parallel part 41A to the load 11. Thus, a current is inhibited from flowing from the parallel part 41A into the first input line 43, and the control circuit 31 can detect opening and closing of the first switch element 21.

(1c) Since the corresponding FET is provided in each of the first switch line 42 and the second switch line 44, it is possible to cause a large current to flow through each of the first switch element 21 and the second switch element 22. Further, the control circuit 31 can detect opening and closing of each of the first switch element 21 and the second switch element 22.

(1d) A selection operation between the first switch element 21 and the second switch element 22 enables a change in the direction of the current to be supplied to the load 11.

(1e) It is possible to supply the current to the load 11 that transforms the vehicle seat 200 while removing insulating films of the first switch element 21 and the second switch element 22.

2. Other Embodiments

Although the present embodiment has been described above, the present disclosure is not limited to the above-described embodiment and can be implemented in various modified forms.

(2a) The switch circuit in the above-described embodiment does not have to necessarily comprise the second switch element. In other words, the switch circuit may comprise only one switch element.

(2b) The switch circuit in the above-described embodiment can be used for articles other than the seat.

(2c) Functions of a single constituent element of the above-described embodiment may be distributed as a plurality of constituent elements, or functions of a plurality of constituent elements may be integrated into a single constituent element. A part of the configuration of the embodiment may be omitted. At least a part of the configuration of the embodiment may be added to or replace with another configuration of the above embodiment. Any mode included in the technical ideas specified by the language of the claims is an embodiment of the present disclosure.

What is claimed is:

1. A switch circuit, comprising:
a first switch element;
a control circuit;
a supply line configured to allow supply of a current from a power source to a load;
a first switch line that connects the first switch element in parallel to a parallel part, which is a part of the supply line;
a first input line configured to allow input of a current from the first switch line to the control circuit;
a first FET and a second FET provided in the parallel part; and
a third FET provided in the first switch line in parallel to the first input line,
wherein the first FET comprises a first body diode having a forward direction coincident with a direction in which a current is supplied to the load,
wherein the second FET comprises a second body diode having a forward direction opposite to the forward direction of the first body diode,
wherein the third FET comprises a third body diode having a forward direction coincident with a direction in which a current is supplied to the load via the first switch element, and
wherein the control circuit is configured to switch on the first FET and the second FET and switch off the third FET when the control circuit receives no current input from the first input line, and to switch off the first FET and the second FET and switch on the third FET when the control circuit receives a current input from the first input line.

2. The switch circuit according to claim 1, further comprising:
a second switch element;
a second switch line that connects the second switch element in parallel to the parallel part;
a second input line configured to allow input of a current from the second switch line to the control circuit; and
a fourth FET provided in the second switch line in parallel to the second input line,
wherein the fourth FET comprises a fourth body diode having a forward direction coincident with a direction in which a current is supplied to the load via the second switch element, and
wherein the control circuit is configured to switch on the first FET and the second FET and switch off the third FET and the fourth FET when the control circuit receives no current input from either the first input line or the second input line, and to switch off the first FET, the second FET and the third FET and switch on the fourth FET when the control circuit receives a current input from the second input line.

3. The switch circuit according to claim 2, further comprising a current switching circuit provided in the supply line between a connection point, at which the first switch line and the second switch line are connected, and the load,
wherein the second switch element is configured not to be closed concurrently with the first switch element, and
wherein the control circuit is configured to control the current switching circuit to cause a current to flow through the load in a first direction when the control circuit receives the current input from the first input line, and to control the current switching circuit to cause a current to flow through the load in a second direction opposite to the first direction when the control circuit receives the current input from the second input line.

4. The switch circuit according to claim 1, wherein the switch circuit is arranged in a vehicle seat.

5. The switch circuit according to claim 2, wherein the switch circuit is arranged in a vehicle seat.

6. The switch circuit according to claim 3, wherein the switch circuit is arranged in a vehicle seat.

* * * * *